United States Patent
Liu et al.

(10) Patent No.: US 9,175,173 B2
(45) Date of Patent: Nov. 3, 2015

(54) UNLOCKING LAYER AND METHOD

(71) Applicant: Taiwan Semiconductor Manufacturing Company, Ltd., Hsin-Chu (TW)

(72) Inventors: Chen-Yu Liu, Kaohsiung (TW); Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 142 days.

(21) Appl. No.: 13/927,984

(22) Filed: Jun. 26, 2013

(65) Prior Publication Data

US 2014/0273506 A1   Sep. 18, 2014

Related U.S. Application Data

(60) Provisional application No. 61/777,692, filed on Mar. 12, 2013.

(51) Int. Cl.
*H01L 21/31* (2006.01)
*C09D 5/00* (2006.01)
(Continued)

(52) U.S. Cl.
CPC ............ *C09D 5/006* (2013.01); *H01L 21/0273* (2013.01); *H01L 21/0276* (2013.01); *H01L 21/02118* (2013.01); *H01L 21/02318* (2013.01);
(Continued)

(58) Field of Classification Search
CPC ................ C09D 5/006; H01L 21/0276; H01L 21/02118
USPC .............. 438/69, 72, 636, 758, 780, 781, 952
See application file for complete search history.

(56) References Cited

U.S. PATENT DOCUMENTS

| 4,072,527 A | 2/1978 | Fan |
| 4,212,935 A | 7/1980 | Canavello et al. |

(Continued)

FOREIGN PATENT DOCUMENTS

| EP | 1500977 | 1/2005 |
| JP | 2006145788 | 6/2006 |

(Continued)

OTHER PUBLICATIONS

Hoo, Ng Wah et al., "The Effect of UPW Quality on Photolithography Defect," Proc. SPIE 7520, Lithography Asia 2009, Dec. 14, 2009, 7 pages, vol. 7520, SPIE, Taipei, Taiwan.

(Continued)

*Primary Examiner* — Kevin M Picardat
(74) *Attorney, Agent, or Firm* — Slater & Matsil, L.L.P.

(57) ABSTRACT

A system and method for anti-reflective layers is provided. In an embodiment the anti-reflective layer comprises a polymer resin which has repeating units within it. At least one of the repeating units comprises a locked unit which has a cyclic structure and a lock within the unit. After the anti-reflective layer has been applied and baked, irregularities such as voids and step heights differences that have occurred may be handled by unlocking the lock within the locked unit. This unlocking breaks the cyclic structure, allowing the polymer to take up more volume and causing the anti-reflective layer to self-expand, filling the voids and reducing the step-height. The unlocking may be performed by exposure or thermal treatments.

20 Claims, 6 Drawing Sheets

(51) Int. Cl.
*H01L 21/02* (2006.01)
*H01L 21/027* (2006.01)
*H01L 21/3105* (2006.01)

(52) U.S. Cl.
CPC ...... *H01L 21/02345* (2013.01); *H01L 21/3105* (2013.01)

(56) References Cited

U.S. PATENT DOCUMENTS

| | | | |
|---|---|---|---|
| 4,268,601 A | 5/1981 | Namiki et al. | |
| 4,289,845 A | 9/1981 | Bowden et al. | |
| 4,346,164 A | 8/1982 | Tabarelli et al. | |
| 4,491,628 A | 1/1985 | Ito et al. | |
| 4,663,275 A | 5/1987 | West et al. | |
| 4,777,119 A | 10/1988 | Brault et al. | |
| 4,939,070 A | 7/1990 | Brunsvold et al. | |
| 5,002,850 A | 3/1991 | Shinozaki et al. | |
| 5,268,260 A | 12/1993 | Bantu et al. | |
| 5,288,588 A | 2/1994 | Yukawa et al. | |
| 5,738,975 A | 4/1998 | Nakano et al. | |
| 5,750,312 A | 5/1998 | Chandross et al. | |
| 5,766,824 A | 6/1998 | Batchelder et al. | |
| 5,856,065 A | 1/1999 | Hagen | |
| 5,863,710 A | 1/1999 | Wakiya et al. | |
| 5,886,102 A | 3/1999 | Sinta et al. | |
| 5,889,141 A | 3/1999 | Marrocco, III et al. | |
| 6,008,265 A | 12/1999 | Vallee et al. | |
| 6,147,249 A | 11/2000 | Watanabe et al. | |
| 6,187,504 B1 | 2/2001 | Suwa et al. | |
| 6,306,554 B1 | 10/2001 | Barclay et al. | |
| 6,627,377 B1 | 9/2003 | Itatani et al. | |
| 6,787,289 B2 | 9/2004 | Yamada et al. | |
| 6,788,477 B2 | 9/2004 | Lin | |
| 6,790,579 B1 | 9/2004 | Goodall et al. | |
| 6,835,527 B2 | 12/2004 | Takata et al. | |
| 6,852,473 B2 | 2/2005 | Roberts et al. | |
| 6,872,503 B2 | 3/2005 | Wheland et al. | |
| 6,875,554 B2 | 4/2005 | Hatanaka et al. | |
| 6,936,400 B2 | 8/2005 | Takasu et al. | |
| 6,952,253 B2 | 10/2005 | Lof et al. | |
| 6,991,888 B2 | 1/2006 | Padmanaban et al. | |
| 7,195,860 B2 | 3/2007 | Endo et al. | |
| 7,235,348 B2 | 6/2007 | Ho et al. | |
| 7,264,918 B2 | 9/2007 | Endo et al. | |
| 7,312,014 B2 | 12/2007 | Maesawa et al. | |
| 7,320,855 B2 | 1/2008 | Huang et al. | |
| 7,344,970 B2 | 3/2008 | Forman et al. | |
| 7,362,412 B2 | 4/2008 | Holmes et al. | |
| 7,393,624 B2 | 7/2008 | Allen et al. | |
| 7,432,035 B2 | 10/2008 | Maeda et al. | |
| 7,432,042 B2 | 10/2008 | Chang et al. | |
| 7,460,206 B2 | 12/2008 | Weissenrieder et al. | |
| 7,470,503 B1 | 12/2008 | Brandl | |
| 7,582,398 B2 | 9/2009 | Iftime et al. | |
| 7,585,612 B2 | 9/2009 | Thackeray et al. | |
| 7,595,141 B2 | 9/2009 | Kudo et al. | |
| 7,608,386 B2 | 10/2009 | Nozaki et al. | |
| 7,648,815 B2 | 1/2010 | Itatani et al. | |
| 7,718,541 B2 | 5/2010 | Makiyama et al. | |
| 7,733,459 B2 | 6/2010 | Dierichs et al. | |
| 7,738,074 B2 | 6/2010 | Streefkerk et al. | |
| 7,779,781 B2 | 8/2010 | Mertens et al. | |
| 7,824,837 B2 | 11/2010 | Wu et al. | |
| 7,846,637 B2 | 12/2010 | Ishizuka et al. | |
| 7,879,529 B2 | 2/2011 | Endo et al. | |
| 7,919,222 B2 | 4/2011 | Vohra et al. | |
| 7,959,141 B2 | 6/2011 | Makino | |
| 7,985,534 B2 | 7/2011 | Tsubaki | |
| 7,989,578 B2 | 8/2011 | Wu | |
| 7,998,655 B2 | 8/2011 | Tsubaki | |
| 8,017,304 B2 | 9/2011 | Tarutani et al. | |
| 8,071,272 B2 | 12/2011 | Tsubaki | |
| 8,088,548 B2 | 1/2012 | Houlihan et al. | |
| 8,088,557 B2 | 1/2012 | Tsubaki | |
| 8,105,748 B2 | 1/2012 | Ohashi et al. | |
| 8,257,901 B2 | 9/2012 | Kim et al. | |
| 8,323,870 B2 | 12/2012 | Lee et al. | |
| 8,329,387 B2 | 12/2012 | Yao et al. | |
| 8,334,338 B2 | 12/2012 | Yoshimura et al. | |
| 8,460,856 B2 | 6/2013 | Yeh et al. | |
| 8,507,177 B2 | 8/2013 | Wang et al. | |
| 8,518,628 B2 | 8/2013 | Chang et al. | |
| 8,586,290 B2 | 11/2013 | Wang et al. | |
| 8,835,307 B2 * | 9/2014 | Akinmade-Yusuff et al. | 438/636 |
| 8,999,624 B2 * | 4/2015 | Chen et al. | 430/271.1 |
| 2001/0044070 A1 | 11/2001 | Uetani et al. | |
| 2002/0015826 A1 | 2/2002 | Desmarteau et al. | |
| 2002/0051933 A1 | 5/2002 | Kodama et al. | |
| 2002/0068237 A1 | 6/2002 | Imai | |
| 2003/0022097 A1 | 1/2003 | Malik et al. | |
| 2003/0073027 A1 | 4/2003 | Namiki et al. | |
| 2003/0079764 A1 | 5/2003 | Hirose et al. | |
| 2003/0087179 A1 | 5/2003 | Iwasaki | |
| 2003/0175624 A1 | 9/2003 | Nozaki et al. | |
| 2004/0084150 A1 | 5/2004 | George et al. | |
| 2004/0096780 A1 | 5/2004 | Nozaki et al. | |
| 2004/0161698 A1 | 8/2004 | Kanagasabapathy et al. | |
| 2004/0180299 A1 | 9/2004 | Rolland et al. | |
| 2005/0134817 A1 | 6/2005 | Nakamura | |
| 2005/0145803 A1 | 7/2005 | Hakey et al. | |
| 2005/0145821 A1 | 7/2005 | French et al. | |
| 2005/0225737 A1 | 10/2005 | Weissenrieder et al. | |
| 2005/0266354 A1 | 12/2005 | Li et al. | |
| 2005/0287466 A1 | 12/2005 | Miyamoto et al. | |
| 2006/0008736 A1 | 1/2006 | Kanda et al. | |
| 2006/0105267 A1 | 5/2006 | Khojasteh et al. | |
| 2006/0141400 A1 | 6/2006 | Hirayama et al. | |
| 2006/0204890 A1 | 9/2006 | Kodama | |
| 2006/0246373 A1 | 11/2006 | Wang | |
| 2006/0257781 A1 | 11/2006 | Benoit et al. | |
| 2006/0257785 A1 | 11/2006 | Johnson | |
| 2007/0031755 A1 | 2/2007 | Hirayama et al. | |
| 2007/0207406 A1 | 9/2007 | Guerrero et al. | |
| 2008/0113300 A2 | 5/2008 | Choi et al. | |
| 2008/0149135 A1 | 6/2008 | Cho et al. | |
| 2008/0160729 A1 | 7/2008 | Krueger et al. | |
| 2008/0187860 A1 | 8/2008 | Tsubaki et al. | |
| 2008/0241778 A1 | 10/2008 | Kulp | |
| 2009/0042147 A1 | 2/2009 | Tsubaki | |
| 2009/0305163 A1 | 12/2009 | Iwashita et al. | |
| 2009/0311624 A1 | 12/2009 | Horiguchi et al. | |
| 2010/0040971 A1 | 2/2010 | Tarutani et al. | |
| 2010/0239984 A1 | 9/2010 | Tsubaki | |
| 2011/0020755 A1 | 1/2011 | Tsubaki | |
| 2011/0097670 A1 | 4/2011 | Wang et al. | |
| 2011/0250543 A1 | 10/2011 | Tsubaki | |
| 2011/0263136 A1 | 10/2011 | Kim et al. | |
| 2012/0052687 A1 | 3/2012 | Raghavan et al. | |
| 2012/0171616 A1 | 7/2012 | Thackeray et al. | |
| 2012/0238106 A1 | 9/2012 | Chuang | |
| 2012/0282553 A1 | 11/2012 | Kimura et al. | |
| 2012/0308741 A1 | 12/2012 | Kim et al. | |
| 2012/0308939 A1 | 12/2012 | Kudo et al. | |
| 2014/0011133 A1 | 1/2014 | Liu et al. | |
| 2014/0342292 A1 * | 11/2014 | Fu et al. | 430/325 |

FOREIGN PATENT DOCUMENTS

| | | |
|---|---|---|
| TW | I336819 | 2/2011 |
| TW | I341961 | 5/2011 |
| TW | I343513 | 6/2011 |
| WO | 2005088397 | 9/2005 |
| WO | 2006054432 | 5/2006 |

OTHER PUBLICATIONS

Kitano, Junichi et al., "Resist pattern collapse prevention for the sub-90nm node," Microlithography World, May 2004, pp. 18-24, PennWell Publishing Corp.

Kunz, Roderick R., KUNZ SPIE Short Course, 21 pages, MIT Lincoln Library, 2002, publisher unknown.

(56) References Cited

OTHER PUBLICATIONS

Lau, Aldrich N. K. et al., "New Thermal Cross-Linkers Based on Triazene: Cross-Linking of Fluorinated Polyimides and Aromatic Polymers," Macromolecules, 1992, pp. 7294-7299, vol. 25.

Reiser, Arnost, Photoreactive Polymers: The Science and Technology of Resists, Feb. 1989, 409 pages, Wiley-Interscience, New York.

Robertson, Stewart et al., "Physical Resist Simulation for a Negative Tone Development Process," 2010 International Symposium on Lithography Extension, Oct. 20-22, 2010, 19 pages.

Sekiguchi, Atsushi et al., "Analysis of Deprotection Reaction in Chemically Amplified Resists Using an Fourier Transform Infrared Spectrometer with an Exposure Tool," Japan J. Appl. Phys., Mar. 2000, pp. 1392-1398, vol. 39, Part 1, No. 3A.

Switkes, M. et al., "Extending optics to 50 nm and beyond with immersion lithography," Journal of Vacuum Science & Technology B: Microelectronics and Nanometer Structures, Nov./Dec. 2003, vol. 21, No. 6., pp. 2794-2799.

Tarutani, Shinji et al., "Process parameter influence to negative tone development process for double patterning," Proc. SPIE 7639, Advances in Resist Materials and Processing Technology XXVII, Mar. 29, 2010, 13 pages, vol. 7639.

Tsvetanova, D. et al., "Degradation of 248 nm Deep UV Photoresist by Ion Implantation," Journal of The Electrochemical Society, Jun. 10, 2011, 10 pages, vol. 158, Issue 8, The Electrochemical Society.

Wu, Chen-Hau et al., "Unlocking Layer and Method," U.S. Appl. No. 14/075,871, Taiwan Semiconductor Manufacturing Company, Ltd., filed Nov. 8, 2013, 46 pages.

\* cited by examiner

UNLOCKING LAYER AND METHOD

This application claims the benefit of U.S. Provisional Application No. 61/777,692, filed on Mar. 12, 2013, entitled Anti-Reflective Layer Method, which application is hereby incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface and then exposed to an energy that has itself been patterned. Such an exposure modifies the chemical and physical properties of the exposed regions of the photolithographic material. This modification, along with the lack of modification in regions of the photolithographic material that were not exposed, can be exploited to remove one region without removing the other.

However, as the size of individual devices has decreased, process windows for photolithographic processing as become tighter and tighter. As such, advances in the field of photolithographic processing, such as the use of anti-reflective layers to prevent undesired reflections of impinging light, have been necessitated in order to keep up the ability to scale down the devices, and further improvements are needed in order to meet the desired design criteria such that the march towards smaller and smaller components may be maintained.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a self-expanding bottom anti-reflective coating utilized in the manufacturing of semiconductor devices at a 28 nm process node or smaller, such as a 20 nm process node or even a 16 nm process node. Other embodiments may also be applied, however, to other coatings in different processes.

Figure 1:
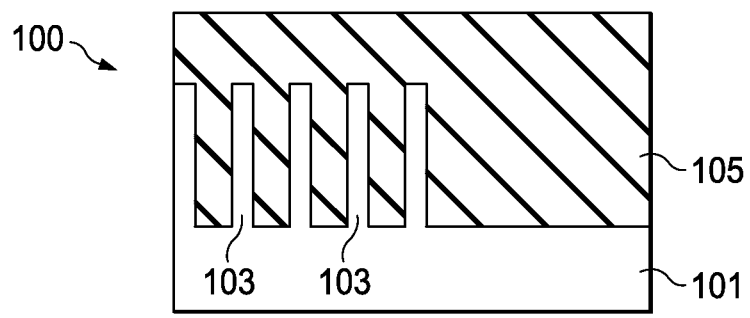
FIG. 1 illustrates a bottom anti-reflective layer on a semiconductor substrate in accordance with an embodiment.

With reference now to FIG. 1, there is shown a semiconductor device 100 with a substrate 101 with fins 103 formed over the substrate 101 and a bottom anti-reflective coating (BARC) layer 105 applied over the fins 103 and the substrate 101. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The fins 103 will serve as a fin structure for the eventual formation of FinFET or multiple gate transistors (not separately illustrated in FIG. 2A) in, e.g., a 16 nm FinFET process. In an embodiment the fins 103 may be formed from the material of the substrate 101 and, as such, may also comprise bulk silicon, doped or undoped, or be an active layer of a SOI substrate. The fins 103 may be formed by first applying a masking material over the substrate 101, patterning the masking material, and then using the masking material as a mask to etch into the substrate 101, thereby forming the fins 103 from the material of the substrate 101.

However, using the material of the substrate 101 to form the fins 103 is only one illustrative method that may be used to form the fins 103. Alternatively, the fins 103 may be formed by initially depositing a semiconductor material, such as silicon, silicon-germanium, or the like, over the substrate 101 and then masking and etching the semiconductor material to form the fins 103 over the substrate 101. In yet another alternative, the fins 103 may be formed by masking the substrate 101 and using, e.g., an epitaxial growth process to grow the fins 103 on the substrate 101. These, and any other suitable method for forming the fins 103 may alternatively be utilized, and all such methods are fully intended to be included within the scope of the embodiments.

The BARC layer 105 is applied over the fins 103 and fills the regions between the fins 103 in preparation for an application of a photoresist 701 (not illustrated in FIG. 1 but illustrated and described below with respect to FIG. 7). The BARC layer 105, as its name suggests, works to prevent the uncontrolled and undesired reflection of energy (e.g., light) such as light back into the overlying photoresist 701 during an exposure of the photoresist 701, thereby preventing the reflecting light from causing reactions in an undesired region of the photoresist 701. Additionally, the BARC layer 105 may be used to provide a planar surface over the substrate 101 and the fins 103, helping to reduce the negative effects of the energy impinging at an angle.

In an embodiment the BARC layer 105 comprises a polymer resin, a catalyst, and a cross-linking agent, all of which are placed into a solvent for dispersal. The polymer resin comprises a polymer chain with repeating units, wherein at least one of the repeating units is a locking monomer with a locked structure. This locked structure, when unlocked, releases the monomer to expand, thereby expanding the polymer in which the monomer is located.

In an embodiment the locked structure is a ring structure that has at least one lock 301 (one example of which is illustrated below in FIG. 3) or locking bond within it. The lock 301 may be a covalent bond that is cleavable by a product of the catalyst (described further below) that is another component of the BARC layer 105. However, in alternative embodiments the lock could comprise any kind of alternative bonding, such as a dipole-dopole interaction, a hydrogen bond, or a metallic bond.

In an embodiment in which the lock is a covalent bond, the lock 301 within the locked structure may have the following structure:

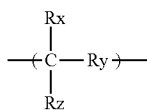

where Rx, Rz, or Ry is a hydrogen, halogen, an alkyl group having a carbon number of 1 to 20, an aminoalkyl group having a carbon number of 1 to 20, an alkoxy group having a carbon number of 1 to 20, an aminoalkyl group having a carbon number of 1 to 20 a hydroxyalkyl group having a carbon number of 1 to 20, a substituted or unsubstituted aryl group having a carbon number of 1 to 20, or a thioalkyl group having a carbon number of 1 to 20.

Specific examples of an alkyl group that may be used for Rx, Rz, or Ry include methyl group, an ethyl group, an n-propyl group, an isopropyl group, a cyclopropyl group, an n-butyl group, an isobutyl group, an s-butyl group, a tert-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1,4-dimethyl-cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group and a 2-ethyl-3-methyl-cyclopropyl group.

Specific examples of an aminoalkyl group that may be used for Rx, Rz, or Ry include an aminomethyl group, an aminoethyl group, and an aminopropyl group.

Specific examples of an alkoxy group that may be used for Rx, Rz, or Ry include a methoxy group, a ethoxy group, a n-propoxy group, a n-propyloxy group, a i-propyloxy group, a iso-propoxy group, a n-butoxy group, a iso-butoxy group, a sec-butoxy group, a tert-butoxy group, a n-pentoxy group, a n-hexoxy group, a n-octoxy group, a n-nonanoxy group, a n-decylkoxy group, a n-butyloxy group, a t-butyloxy group, a 2-ethylhexyloxy group, a n-decyloxy group, a phenethyloxy group and a phenoxyethoxy group.

Specific examples of an hydroxyalkyl group that may be used for Rx, Rz, or Ry include a hydroxymethyl group, a 1-hydroxyethyl group, a 2-hydroxyethyl group, a 1-hydroxypropyl group, a 2-hydroxypropyl group and a 3-hydroxypropyl group.

Specific examples of an hydroxyalkyl group that may be used for Rx, Rz, or Ry include a phenyl group, a naphthyl group, a biphenyl group, a 2-methylphenyl group, a 3-methylphenyl group, a 4-methylphenyl group, a cumenyl group, a fluorenyl group, a p-methoxyphenyl group, a tolyl group, a xylyl group, a butylphenyl group, an octylphenyl group, and a chlorophenyl group.

Specific examples of a thioalkyl group that may be used for Rx, Rz, or Ry include a thiomethyl group, a thioethyl group, a thiopropyl group, a thiobutyl group, a thiopentyl group, a thiohexyl group, a thiocyclopentyl group, a thiocyclohexyl group Alternatively, the lock 301 within the locked structure may have the following structure:

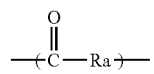

where Ra is an alkyl group having a carbon number of 1 to 20, an aminoalkyl group having a carbon number of 1 to 20, an alkyloxy group having a carbon number of 1 to 20, a hydroxyalkyl group having a carbon number of 1 to 20, a substituted or unsubstituted aryl group having a carbon number of 1 to 20, or a thioalkyl group having a carbon number of 1 to 20. In this embodiment the aminoalkyl group, the alkyloxy group, the hydroxyalkyl group, the aryl group, and the thioalkyl group may be similar to the groups discussed above with respect to the previous lock 301. In more particular embodiments Ra may be an alkyloxy, an aminoalkyl, and a thioalkyl group, or the like.

In yet another embodiment the lock 301 within the locked structure may have the following structure:

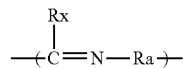

where Rx is a hydrogen, halogen, an alkyl group having a carbon number of 1 to 20, an aminoalkyl group having a carbon number of 1 to 20, an alkyloxy group having a carbon number of 1 to 20, an aminoalkyl group having a carbon number of 1 to 20 a hydroxyalkyl group having a carbon number of 1 to 20, a substituted or unsubstituted aryl group having a carbon number of 1 to 20, or a thioalkyl group having a carbon number of 1 to 20 and where Ra is an alkyl group having a carbon number of 1 to 20, an aminoalkyl group having a carbon number of 1 to 20, an alkyloxy group having a carbon number of 1 to 20, a hydroxyalkyl group having a carbon number of 1 to 20, a substituted or unsubstituted aryl group having a carbon number of 1 to 20, or a thioalkyl group having a carbon number of 1 to 20. In this embodiment the aminoalkyl group, the alkyloxy group, the hydroxyalkyl group, the aryl group, and the thioalkyl group may be similar to the groups discussed above with respect to the previous lock 301. In more particular embodiments Ra may be an alkyloxy, an aminoalkyl, and a thioalkyl group or the like.

The lock 301 as described above is incorporated into a ring structure to form the locked structure. In an embodiment the locked structure comprises the lock 301 bonded in a ring with other units, such as chromophore units. In an embodiment the chromophore units are light absorbing units that absorb light at the wavelength which is used to expose the photoresist 701. Such chromophore units include hydrocarbon aromatic moieties and heterocyclic aromatic moieties with from one to four rings, either separated from each other or fused together, wherein there are from three to ten carbons in each ring.

As one particular example of a locking monomer, the locking monomer may have the following structure:

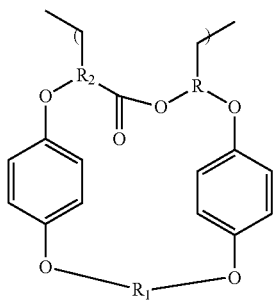

wherein R, R1, and R2 may be the same or different and each represents an alkyl group having a carbon number of 1 to 20, an aminoalkyl group having a carbon number of 1 to 20, a hydroxyalkyl group having a carbon number of 1 to 20 or a substituted or unsubstituted aryl group having a carbon number of 1 to 20.

In an embodiment a locked monomer is one monomer that repeats within the polymer resin. However, while the locked monomer may be used by itself to form the polymer resin, in other embodiments the polymer resin is a combination of the locked monomer and other monomers repeating together to form the polymer resin.

The other repeating resins may comprise a cross-linking monomer and a monomer with chromophore units, as described above with respect to the locking monomer. In an embodiment the monomer with the chromophore unit may comprise vinyl compounds containing substituted and unsubstituted phenyl, substituted and unsubstituted anthracyl, substituted and unsubstituted phenanthryl, substituted and unsubstituted naphthyl, substituted and unsubstituted heterocyclic rings containing heteroatoms such as oxygen, nitrogen, sulfur, or combinations thereof, such as pyrrolidinyl, pyranyl, piperidinyl, acridinyl, quinolinyl. The substituents in these units may be any hydrocarbyl group and may further contain heteroatoms, such as, oxygen, nitrogen, sulfur or combinations thereof, such as alkylenes, ester, ethers, combinations of these, or the like, with a number of carbon atoms between 1 and 12.

In specific embodiments the monomers with chromophore units include styrene, hydroxystyrene, acetoxystyrene, vinyl benzoate, vinyl 4-tert-butylbenzoate, ethylene glycol phenyl ether acrylate, phenoxypropyl acrylate, N-methyl maleimide, 2-(4-benzoyl-3-hydroxyphenoxy)ethyl acrylate, 2-hydroxy-3-phenoxypropyl acrylate, phenyl methacrylate, benzyl methacrylate, 9-anthracenylmethyl methacrylate, 9-vinylanthracene, 2-vinylnaphthalene, N-vinylphthalimide, N-(3-hydroxy)phenyl methacrylamide, N-(3-hydroxy-4-hydroxycarbonylphenylazo)phenyl methacrylamide, N-(3-hydroxyl-4-ethoxycarbonylphenylazo)phenyl methacrylamide, N-(2,4-dinitrophenylamino phenyl)maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, tetrahydroammonium sulfate salt of 3-(4-sulfophenyl)azoacetoacetoxy ethyl methacrylate combinations of these, or the like. However, any suitable monomer with chromophore units to absorb the impinging light and prevent the light from being reflected may alternatively be used, and all such monomers are fully intended to be included within the scope of the embodiments.

The cross-linking monomer may be used to cross-link the monomer with other polymers within the polymer resin, to modify the solubility of the BARC layer 105, and may optionally have an acid labile group. In a particular embodiment the cross-linking monomer may comprise a hydrocarbon chain that also comprises, e.g., a hydroxyl group, a carboxyl acid group, a carboxylic ester group, epoxy groups, urethane groups, amide groups, combinations of the, and the like. Specific examples of cross-linking monomers that may be utilized include polyhydroxystyrene, poly(hydroxynaphthalene), poly(meth)acrylates, polyarylates, polyesters, polyurethanes, alkyd resins (aliphatic polyesters), poly(hydroxystyrene-methylmethacrylate), homopolymers and/or copolymers obtained by polymerization of at least one of the following monomers: styrene, hydroxystyrene, hydroxyethyl (meth)acrylate, hydroxypropyl(meth)acrylate, methyl(meth)acrylate, ethyl(meth)acrylate, (meth)acrylic acid, poly(hydroxystyrene-styrene-methacrylate), poly(4-hydroxystyrene), and poly(pyromellitic dianhydride-ethylene glycol-propylene oxide).

Additionally, as one of ordinary skill in the art will recognize, the above description for the various monomers that may be polymerized to form the polymer resin for the BARC layer 105 are intended to be illustrative and are not intended to limit the embodiments in any fashion. Rather, any suitable monomer or combination of monomers that perform the desired functions of the monomers described herein may also be utilized. All such monomers are fully intended to be included within the scope of the embodiments.

The catalyst may be a compound that is used to generate a chemically active species and initiate a cross-linking reaction between the polymers within the polymer resin and may be, e.g., thermal acid generator, a photoacid generator, or a photobase generator, suitable combinations of these, or the like. In an embodiment in which the catalyst is a thermal acid generator, the catalyst will generate an acid when sufficient heat is applied to the BARC layer 105. Specific examples of the thermal acid generator include butane sulfonic acid, triflic acid, nonaflurobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, combinations of these, or the like.

In an embodiment in which the catalyst is a photoacid generator, the catalyst may comprise halogenated triazines, onium salts, diazonium salts, aromatic diazonium salts, phosphonium salts, sulfonium salts, iodonium salts, imide sulfonate, oxime sulfonate, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1]hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, a,&-bis-sulfonyl-diazomethanes, sulfonate esters of nitrosubstituted benzyl alcohols, naphthoquinone-4-diazides, alkyl disulfones, and the like.

In other embodiment the catalyst may be a photobase generator. In such an embodiment the photobase generator may comprise quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like.

The cross-linking agent may also be added to the BARC layer 105. The cross-linking agent reacts with the polymers within the polymer resin within the BARC layer 105 after exposure, assisting in increasing the cross-linking density of the photoresist, which helps to improve the resist pattern and resistance to dry etching. In an embodiment the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, a polyether polyol, a polyglycidy ether, a vinyl ether, a triazine, combinations of these, or the like.

Specific examples of materials that may be utilized as a cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl)norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl)ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ethe-r of a phenol novolak resin, pentaerythritol tetra(3-acetoxy-2-hydroxyprop-yl)ether, pentaerythritol poly(3-chloroacetoxy-2-hydroxypropyl)ether, trimethylolmethane tri(3-acetoxy-2-hydroxypropyl)ether, combinations of these, or the like.

Additionally, as one of ordinary skill in the art will recognize, the precise examples listed above regarding the structures and groups that may be used within the polymer resin, the catalyst, and the cross-linking agent are merely intended to be illustrative and are not intended to list every possible structure or groups that may be utilized to form the polymer resin, the catalyst, and the cross-linking agent. Any suitable alternative structures and any suitable alternative groups may be used to form the polymer resin, the catalyst, and the cross-linking agent, and all such structures and groups are fully intended to be included within the scope of the embodiments.

The individual components of the BARC layer 105 may be placed into the BARC solvent in order to aid in the mixing and placement of the BARC layer 105. To aid in the mixing and placement of the BARC layer 105, the solvent is chosen at least in part based upon the materials and monomers chosen for the polymer resin of the BARC layer 105 as well as the catalyst and the cross-linking agent. In particular, the BARC solvent is chosen such that the polymer resin, the catalyst, and the cross-linking agent can be evenly dissolved into the BARC solvent and dispensed upon the substrate 101 and the fins 103.

In an embodiment the BARC solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the BARC solvent include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl cellusolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether acetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, ethyl lactate, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monophenylether, dipropylene glycol monoacetate, dioxane, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monomethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the solvent component of the BARC layer 105 are merely illustrative and are not intended to limit the embodiments. Rather, any suitable material that may dissolve the polymer resin, the catalyst, and the cross-linking agent may alternatively be utilized to help mix and apply the BARC layer 105. All such materials are fully intended to be included within the scope of the embodiments.

Additionally, other components may also be added into the material for the BARC layer 105 if desired. For example, in an embodiment the monomeric dyes, surface leveling agents, adhesion promoters, anti-foaming agent, and the like, may alternatively be utilized. Any suitable additive may be added into the material for the BARC layer 105, and all such additives are fully intended to be included within the scope of the embodiments.

In an embodiment the polymer resins (comprising the locked monomer), the catalyst, and the cross-linking agent, along with any desired additives or other agents, are added to the BARC solvent to form the material for the BARC layer 105. The polymer resins may have a concentration of between about 0.1% and about 30%, such as about 10%, the catalyst may have a concentration of between about 0.1% and about 30%, such as about 5%, and the cross-linking agent may have a concentration of between about 10% and about 20%, such as about 5%.

Once added, the mixture is then mixed in order to achieve an even and constant composition throughout the material for the BARC layer 105 in order to ensure that there are no defects caused by an uneven mixing or non-constant composition of the material for the BARC layer 105. Once mixed together, the material for the BARC layer 105 may either be stored prior to its usage or else used immediately.

Once the material for the BARC layer 105 has been prepared, the material for the BARC layer 105 may be utilized by initially applying the material for the BARC layer 105 onto the substrate 101 and the fins 103. The material for the BARC layer 105 may be applied to the substrate 101 and the fins 103 so that the material for the BARC layer 105 coats an upper exposed surface of the substrate 101 and the fins 103, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the BARC layer 105 may be applied such that it has a thickness over a top of the fins 103 of between about 50 nm and about 500 nm, such as about 300 nm.

Figure 2:
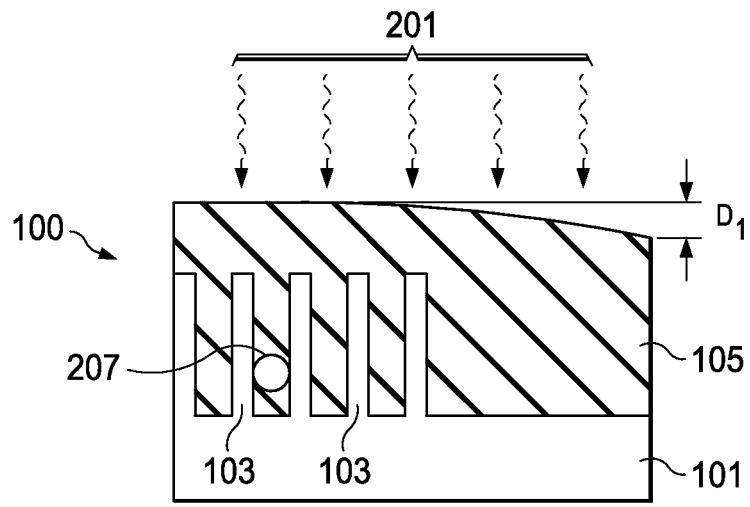
FIG. 2 illustrates baking of the bottom anti-reflective layer in accordance with an embodiment.

FIG. 2 illustrates a pre-bake of the BARC layer 105 (represented in FIG. 2 by the wavy lines labeled 201) and its resulting consequences. In an embodiment once the BARC layer 105 has been applied to the substrate 101 and the fins 103, the pre-bake 201 of the BARC layer 105 is performed in order to initiate a cross-linking reaction between the polymers within the polymer resin and the cross-linking agent as well as to dry the BARC layer 105 prior to the application of the photoresist 701. The curing and drying of the BARC layer 105 removes a portion of the BARC solvent components but leaves behind the polymers, the catalysts, the cross-linking agent, and other additives. In an embodiment the pre-bake 201 may be performed at a temperature suitable to evaporate the BARC solvent and initiate the cross-linking reaction, such as between about 40° C. and 150° C., although the precise temperature depends upon the materials chosen for the BARC layer 105. The pre-bake 201 is performed for a time sufficient to cure and dry the BARC layer 105, such as between about 10 seconds to about 5 minutes, such as about 90 seconds.

However, the pre-bake 201 of the BARC layer 105 also has a number of negative consequences. In particular, because the BARC layer 105 covers an uneven surface of surfaces (including the surface of the substrate 101 as well as the fins 103 extending from the surface of the substrate 101), there is an uneven distribution of heat transfer through the BARC layer 105 during the pre-bake 201. For example, in a region in which the BARC layer 105 covers the fins 103, the heat applied to the BARC layer 105 in this region will transfer into the BARC solvent (which will help to drive off the BARC solvent) but will also transfer into the fins 103, thereby removing heat from the BARC solvent. However, in regions where the fins 103 are not located (and so cannot remove heat from the BARC solvent), the heat will transfer into the BARC solvent and be used for vaporization of the BARC solvent.

As such, because one section of the BARC solvent (the section over the fins 103) has heat being removed from it while another section (the section not over the fins 103) does not, the BARC solvent does not vaporize evenly out of the BARC layer 105. In particular, in the areas where no fins 103 are located to remove heat the BARC solvent may vaporize at a faster rate than sections of the BARC solvent that are located over regions that do include the fins 103. As such, more of the BARC solvent will be vaporized in one region than in another, causing a thickness in one region to be thinner than in the other region. In a particular embodiment, the difference in heights may be a first distance $D_1$ such as greater than about 50 nm.

Additionally, in embodiments in which the catalyst is a thermal acid generator, the pre-bake 201 will induce the catalyst to generate acid, which will then initiate cross-linking reactions within the BARC layer 105. For example, the acids can induce the cross-linking agent to start reacting with the polymers within the polymer resin to produce the cross-linked polymers. One such cross-linking reaction may be represented by the following chemical formula:

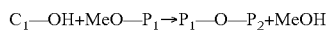

where C1 is a cross-linking agent with an OH group and P1 is a polymer comprising an MeO group. As can be seen, when the cross-linking agent reacts with the polymers within the polymer resin, the cross-linking agent forms the cross-linked polymers, but also drives off a MeOH as a by-product. This by-product (and other reaction by-products that may be formed) will vaporize within the BARC layer 105 itself (not necessarily at its surface) and will causing voids (represented in FIG. 2 by the circle labeled 207) to occur within the BARC layer 105. These voids 207 may lead to undesirable process defects during later processing.

Figure 3A:
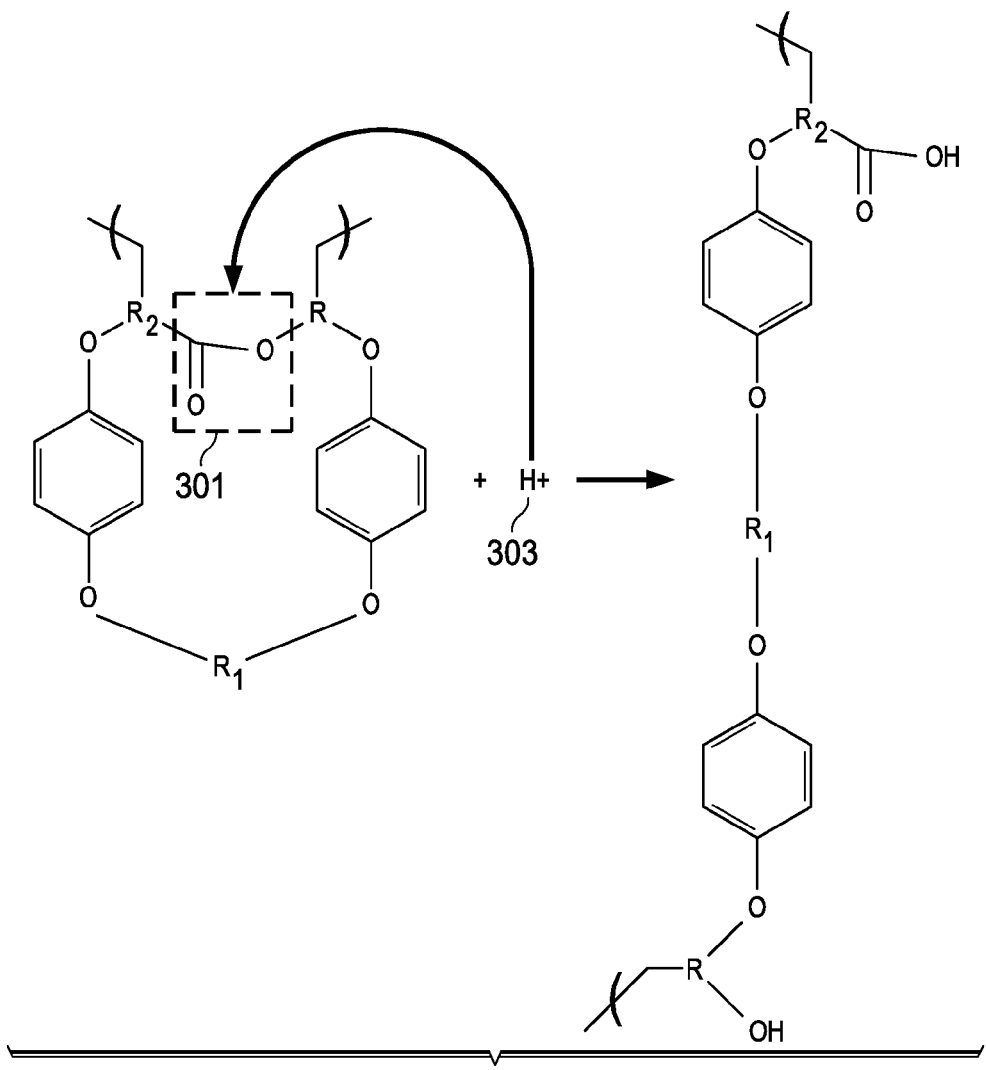
FIGS. 3A-3B illustrate an unlocking and an expansion of the material of the anti-reflective layer in accordance with an embodiment.
Figure 3B:
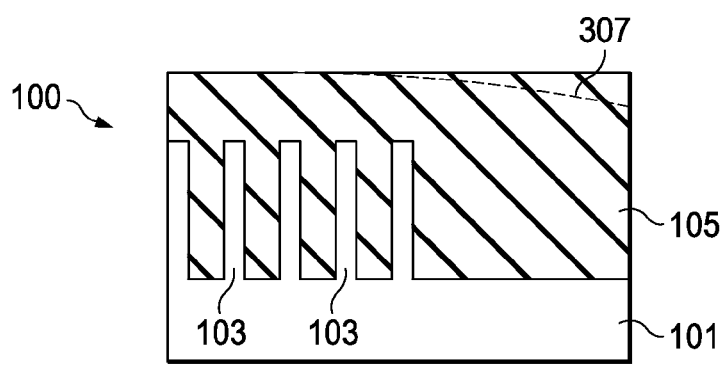

FIGS. 3A-3B illustrate one embodiment in which the differences in height and the voids 207 may be reduced or eliminated by unlocking the locked structure within the locked monomer of the BARC layer 105. In an embodiment the lock 301 within the locked structure may be cleaved in a hydrolysis reaction initiated by, e.g., an acid generated by the catalyst during the pre-bake 201. For example, in an embodiment in which the catalyst is a thermal acid generator, the thermal acid generator will form an acid (e.g., a $H^+$ atom) during the pre-bake 201. The acid will break the bonds within the lock 301, cleaving the lock 301 and allowing the locked structure to expand.

FIG. 3A illustrates a molecular chemical reaction of one particular embodiment of a locked monomer being cleaved by an acid generated by the catalyst. As illustrated, the acid (e.g., the $H^+$ atom labeled 303) will react with the chemical bonds in the lock 301 (represented in FIG. 3A by the dashed line 301), and particularly the bond between the carbon atom and the single bonded oxygen atom in the carboxyl group of the lock 301. This reaction will break the bond within the lock 301, thereby cleaving the lock 301 within the locked structure.

Once the lock 301 has been cleaved and unlocked, there is no longer a bond forcing the cyclic structure to remain in such a tight, cyclic form. As such, once the lock 301 has been cleaved the other bonds and forces within the previously locked structure will pull the locked structure out of its previous cyclic form. As a result, the previously locked structure will transform from a cyclic structure to a more linear form (although the precise structural shape will be determined by the atomic makeup of the now unlocked structure).

Such a reshaping of the locked structure from a more cyclic to a more linear form also means that the now unlocked monomer will have an increased length and take up more space and volume than the locked monomer did prior to the lock 301 being cleaved. As such, with each of the locked monomers in the polymers now being unlocked, the overall density of the polymer resin will be decrease. As such, because one of the components of the BARC layer 105 is decreasing in density, the overall density of the BARC layer 105 itself will decrease, causing the BARC layer 105 to take up more space and essentially become self-expanding.

FIG. 3B illustrates a result of this self-expansion of the BARC layer 105. In particular, as the locked monomers are unlocked and the BARC layer 105 expands, the differences in thickness in the BARC layer 105 will be reduced or eliminated. In particular the BARC layer 105 will expand away from its original position after the pre-bake 201 (illustrated in FIG. 3B by the dashed line labeled 307). Additionally, as the BARC layer 105 expands, the voids 107 that were previously formed within the BARC layer 105 may be eliminated by the expanding material expanding into the voids 107 or reduced in size so as to minimize their effect on later processing.

Figure 4:
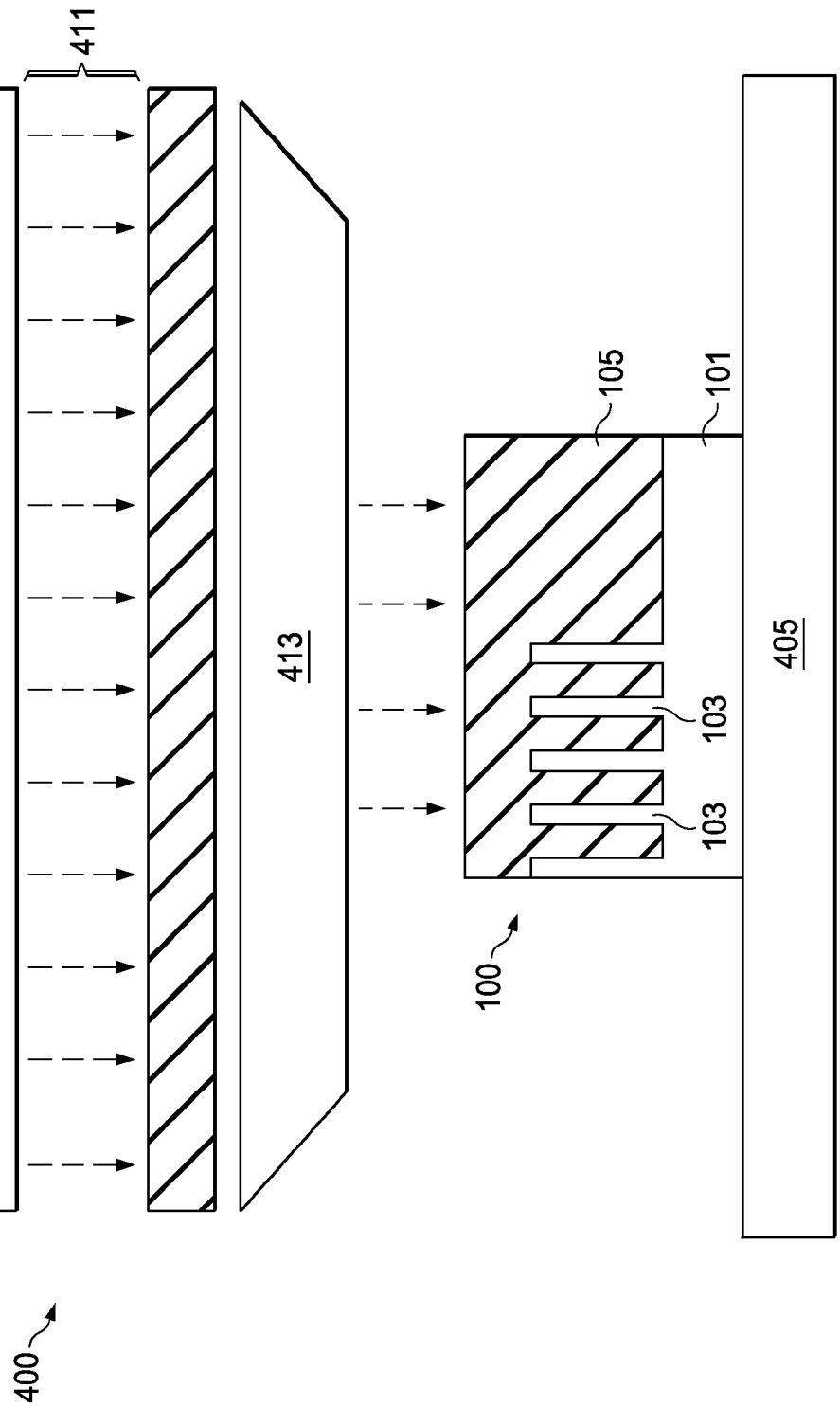
FIG. 4 illustrates an exposure process to unlock the material of the anti-reflective layer in accordance with an embodiment.

FIG. 4 illustrates one embodiment in which the catalyst may initiate the unlocking of the locked monomers using an exposure process. In an embodiment the exposure may be initiated by placing the substrate 101 and the BARC layer 105, once cured and dried, into an imaging device 400 for exposure. The imaging device 400 may comprise a support plate 405, an energy source 407, and optics 413. In an embodiment the support plate 405 is a surface to which the semiconductor device 100 and the BARC layer 105 may be placed or attached to and which provides support and control to the substrate 101 during exposure of the BARC layer 105. Additionally, the support plate 405 may be movable along one or more axes, as well as providing any desired heating or cooling to the substrate 101 and BARC layer 105 in order to prevent temperature gradients from affecting the exposure process.

In an embodiment the energy source 407 supplies energy 411 such as light to the BARC layer 105 in order to induce a reaction of the photoacid generators, which in turn reacts with the locks in the locked monomers to unlock the locked monomers. In an embodiment the energy 411 may be electromagnetic radiation, such as g-rays (with a wavelength of about 436 nm), i-rays (with a wavelength of about 365 nm), ultraviolet radiation, far ultraviolet radiation, x-rays, electron beams, or the like. The energy source 407 may be a source of the electromagnetic radiation, and may be a KrF excimer laser light (with a wavelength of 248 nm), an ArF excimer laser light (with a wavelength of 193 nm), a $F_2$ excimer laser light (with a wavelength of 157 nm), or the like, although any other suitable source of energy 411, such as mercury vapor lamps, xenon lamps, carbon arc lamps or the like, may alternatively be utilized.

Optics (represented in FIG. 4 by the trapezoid labeled 413) may be used to concentrate, expand, reflect, or otherwise control the energy 411 as it leaves the energy source 407 and is directed towards the BARC layer 105. In an embodiment the optics 413 comprise one or more lenses, mirrors, filters, combinations of these, or the like to control the energy 411 along its path.

In an embodiment the semiconductor device 100 with the BARC layer 105 is placed on the support plate 405. Once the BARC layer 105 is in position, the energy source 407 generates the desired energy 411 (e.g., light) which passes through the optics 413 on its way to the BARC layer 105. The energy 411 impinges upon the BARC layer 105 and induces a reaction of the photoacid generators within the BARC layer 105. The chemical reaction products of the photoacid generators absorption of the energy 411 (e.g., acids/bases/free radicals) then reacts with the locks within the locked monomers of the polymer resin, unlocking the locks and causing the BARC layer 105 to expand.

Figure 5:
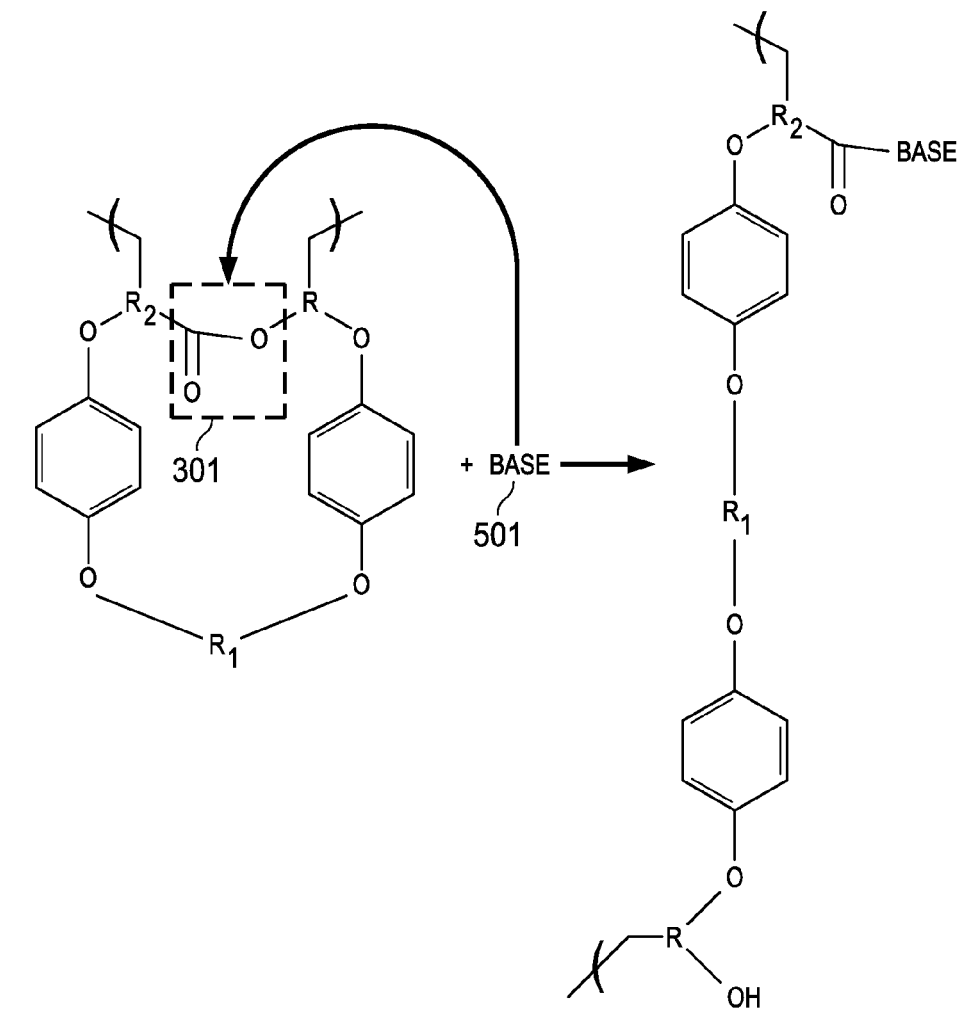
FIG. 5 illustrates one possible reaction mechanism that may be used to unlock the material of the anti-reflective layer in accordance with an embodiment.

FIG. 5 illustrates one possible chemical reaction mechanism in an embodiment in which the catalyst is a photobase generator and the unlocking is performed using an exposure process similar to the one described above with respect to FIG. 4. In this embodiment, rather than the catalyst generating an acid, the catalyst, upon absorbing the impinging light from the exposure process, will generate a base (represented in FIG. 5 by the number 501), such as amine. This base 501 will then cleave the lock 301 within the locked monomer, unlocking the locked monomer and allowing the cyclic locked monomer to expand to a more linear shape, thereby decreasing the density of the BARC layer 105 in general and causing the BARC layer 105 to self-expand.

Figure 6:
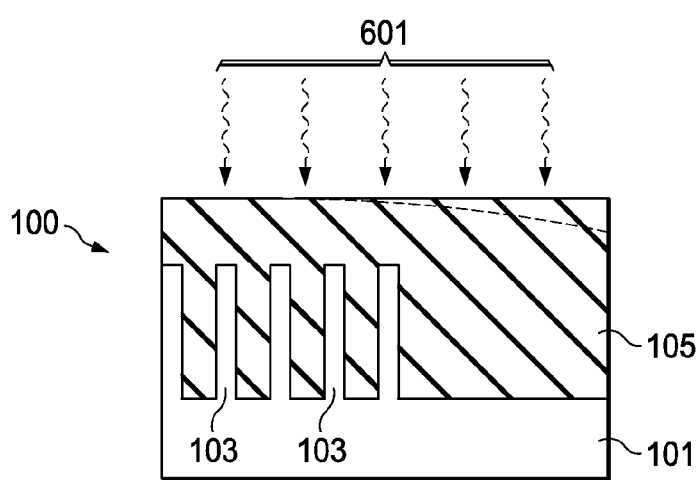
FIG. 6 illustrates a baking process to unlock the material of the anti-reflective layer in accordance with an embodiment.

FIG. 6 illustrates yet another embodiment that may be used to unlock the locked monomer in which the catalyst is a thermal acid generator. In this embodiment an unlocking bake process (represented in FIG. 6 by the wavy lines labeled 601) is utilized to activate the thermal acid generator and generate an acid. In an embodiment the BARC layer 105 is heated to a temperature such that the thermal acid generator will generate an acid (e.g., a $H^+$ atom). Once generated, the acid will cleave the lock 301 within the locked monomer as described above with respect to FIG. 3A, and the BARC layer 105 will self-expand.

In a particular embodiment the unlocking bake 601 may be performed by placing the substrate 101 and overlying BARC layer 105 onto, e.g., a hot-plate (not individually illustrated) with heating elements inside of the hot-plate, although any suitable heating device (such as a furnace) may alternatively be used. The heating elements may then be engaged to heat the hot-plate and, thus, heat the substrate 101 and the BARC layer 105. In an embodiment the BARC layer 105 may be heated to a temperature of between about 100° C. and about 350° C., such as about 250° C.

In yet another embodiment the two-step baking process described above with respect to FIGS. 1-6 (e.g., the original pre-bake 201 to drive off solvent described with respect to FIG. 2 and the unlocking bake 601 described with respect to FIG. 6), may be replaced with a single bake to perform the cross-linking as well as to perform the unlocking of the locked monomers. In an embodiment the single bake may be performed at a temperature of between about 100° C. and about 350° C., such as about 250° C. By performing the single bake at this temperature, the thermal acid generator will generate enough acid to initiate the cross-linking while also generating enough acid to cleave the locks on the locked monomers. As such, the BARC layer 105 will cure and unlock in a single step, resulting in process efficiencies.

Figure 7A:
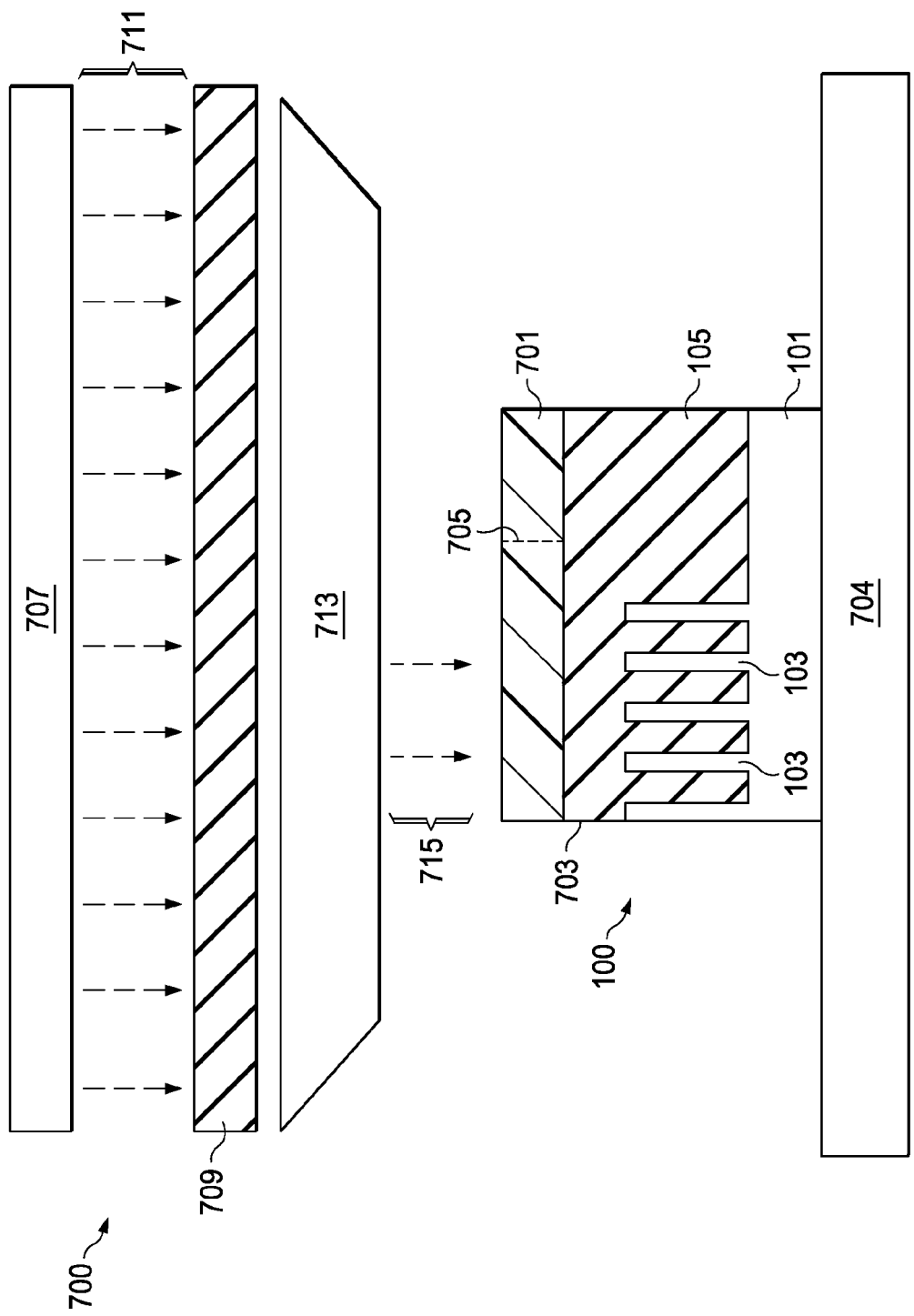
FIGS. 7A-7B illustrate an application, exposure, and development of a photoresist in accordance with an embodiment.
Figure 7B:
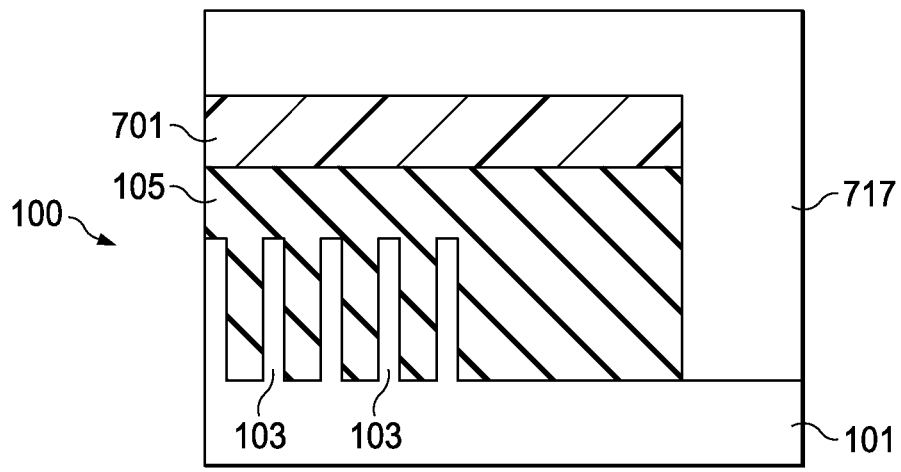

FIGS. 7A-7B illustrates an application, exposure, and development of a photoresist 701 over the BARC layer 105. In an embodiment the photoresist 701 includes a photoresist polymer resin along with one or more photoactive compounds (PACs) in a photoresist solvent. In an embodiment the photoresist polymer resin may comprise a hydrocarbon structure (such as a alicyclic hydrocarbon structure) that contains one or more groups that will decompose (e.g., acid labile groups) or otherwise react when mixed with acids, bases, or free radicals generated by the PACs (as further described below). In an embodiment the hydrocarbon structure comprises a repeating unit that forms a skeletal backbone of the photoresist polymer resin. This repeating unit may include acrylic esters, methacrylic esters, crotonic esters, vinyl esters, maleic diesters, fumaric diesters, itaconic diesters, (meth) acrylonitrile, (meth)acrylamides, styrenes, vinyl ethers, combinations of these, or the like.

Specific structures which may be utilized for the repeating unit of the hydrocarbon structure include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl(meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In an embodiment the repeating unit of the hydrocarbon structure may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include adamantine, norbornane, isobornane, tricyclodecane, tetracycododecane, or the like.

The group which will decompose, otherwise known as a leaving group or, in an embodiment in which the PAC is a photoacid generator, an acid labile group, is attached to the hydrocarbon structure so that it will react with the acids/bases/free radicals generated by the PACs during exposure. In an embodiment the group which will decompose may be a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl)imido group, a bis(alkylcarbonyl)methylene gourp, a bis(alkylcarbonyl) imido group, a bis(alkylsylfonyl)methylene group, a bis (alkylsulfonyl)imido group, a tris(alkylcarbonyl methylene group, a tris(alkylsulfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

In an embodiment the photoresist polymer resin may also comprise other groups attached to the hydrocarbon structure that help to improve a variety of properties of the polymerizable resin. For example, inclusion of a lactone group to the hydrocarbon structure assists to reduce the amount of line edge roughness after the photoresist 701 has been developed, thereby helping to reduce the number of defects that occur during development. In an embodiment the lactone groups may include rings having five to seven members, although any suitable lactone structure may alternatively be used for the lactone group.

The photoresist polymer resin may also comprise groups that can assist in increasing the adhesiveness of the photoresist 701 to underlying structures (e.g., the BARC layer 105). In an embodiment polar groups may be used to help increase the adhesiveness, and polar groups that may be used in this embodiment include hydroxyl groups, cyano groups, or the like, although any suitable polar group may alternatively be utilized.

Optionally, the photoresist polymer resin may further comprise one or more alicyclic hydrocarbon structures that do not also contain a group which will decompose. In an embodiment the hydrocarbon structure that does not contain a group which will decompose may include structures such as 1-adamantyl(meth)acrylate, tricyclodecanyl(meth)acrylate, cyclohexayl (meth)acrylate, combinations of these, or the like.

Additionally, the photoresist 701 also comprises one or more PACs. The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1] hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis (dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the PACs are a photobase generator, the PACs may comprise quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may alternatively be utilized, and all such PACs are fully intended to be included within the scope of the present embodiments.

The individual components of the photoresist 701 may be placed into a photoresist solvent in order to aid in the mixing and placement of the photoresist 701. To aid in the mixing and placement of the photoresist 701, the photoresist solvent is chosen at least in part based upon the materials chosen for the photoresist polymer resin as well as the PACs. In particular, the photoresist solvent is chosen such that the photoresist polymer resin and the PACs can be evenly dissolved into the photoresist solvent and dispensed upon the BARC layer 105.

In an embodiment the photoresist solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the photoresist solvent for the photoresist 701 include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl cellusolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether acetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, ethyl lactate, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monophenylether, dipropylene glycol monoacetate, dioxane, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the photoresist solvent component of the photoresist 701 are merely illustrative and are not intended to limit the embodiments. Rather, any suitable material that may dissolve the photoresist polymer resin and the PACs may alternatively be utilized to help mix and apply the photoresist 701. All such materials are fully intended to be included within the scope of the embodiments.

Additionally, while individual ones of the above described materials may be used as the photoresist solvent for the photoresist 701, in alternative embodiments more than one of the above described materials may be utilized. For example, the photoresist solvent may comprise a combination mixture of two or more of the materials described. All such combinations are fully intended to be included within the scope of the embodiments.

Optionally, a photoresist cross-linking agent may also be added to the photoresist 701. The photoresist cross-linking agent reacts with the photoresist polymer resin within the photoresist 701 after exposure, assisting in increasing the cross-linking density of the photoresist, which helps to improve the resist pattern and resistance to dry etching. In an embodiment the photoresist cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Specific examples of materials that may be utilized as a photoresist cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl) norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl)ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ethe-r of a phenol novolak resin, pentaerythritol tetra(3-acetoxy-2-hydroxyprop-yl)ether, pentaerythritol poly(3-chloroacetoxy-2-hydroxypropyl)ether, trimethylolmethane tri(3-acetoxy-2-hydroxypropyl)ether, combinations of these, or the like.

In addition to the photoresist polymer resins, the PACs, the photoresist solvents, and the photoresist cross-linking agents, the photoresist 701 may also include a number of other additives that will assist the photoresist 701 obtain the highest resolution. For example, the photoresist 701 may also include surfactants in order to help improve the ability of the photoresist 701 to coat the surface on which it is applied. In an embodiment the surfactants may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, combinations of these, or the like.

Another additive that may be added to the photoresist 701 is a quencher, which may be utilized to inhibit diffusion of the generated acids/bases/free radicals within the photoresist, which helps the resist pattern configuration as well as to improve the stability of the photoresist 701 over time. In an embodiment the quencher is an amine such as a second lower aliphatic amine, a tertiary lower aliphatic amine, or the like. Specific examples of amines that may be used include trimethylamine, diethylamine, triethylamine, di-n-propylamine, tri-n-propylamine, tripentylamine, diethanolamine, and triethanolamine, alkanolamine, combinations of these, or the like.

Alternatively, an organic acid may be utilized as the quencher. Specific embodiments of organic acids that may be utilized include malonic acid, citric acid, malic acid, succinic acid, benzoic acid, salicylic acid, phosphorous oxo acid and its derivatives such as phosphoric acid and derivatives thereof such as its esters, such as phosphoric acid, phosphoric acid di-n-butyl ester and phosphoric acid diphenyl ester; phosphonic acid and derivatives thereof such as its ester, such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phosphinic acid and phenylphosphinic acid.

Another additive that may be added to the photoresist 701 is a stabilizer, which assists in preventing undesired diffusion of the acids generated during exposure of the photoresist 701. In an embodiment the stabilizer may include nitrogenous compounds such as aliphatic primary, secondary, and tertiary amines, cyclic amines such as piperidines, pyrrolidines, morpholines, aromatic heterocycles such as pyridines, pyrimidines, purines, imines such as diazabicycloundecene, guanidines, imides, amides, and others. Alternatively, ammonium salts may also be used for the stabilizer, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Yet another additive that may be added to the photoresist 701 may be a dissolution inhibitor in order to help control dissolution of the photoresist 701 during development. In an embodiment bile-salt esters may be utilized as the dissolution inhibitor. Specific examples of materials that may be utilized include cholic acid (IV), deoxycholic acid (V), lithocholic acid (VI), t-butyl deoxycholate (VII), t-butyl lithocholate (VIII), and t-butyl-3-α-acetyl lithocholate (IX).

Another additive that may be added to the photoresist 701 may be a plasticizer. Plasticizers may be used to reduce delamination and cracking between the photoresist 701 and underlying layers (e.g., the BARC layer 105) and may comprise monomeric, oligomeric, and polymeric plasticizers such as oligo-and polyethyleneglycol ethers, cycloaliphatic esters, and non-acid reactive steroidally-derived materials. Specific examples of materials that may be used for the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerine and the like.

Yet another additive that may be added include a coloring agent, which helps observers examine the photoresist 701 and find any defects that may need to be remedied prior to further processing. In an embodiment the coloring agent may be either a triarylmethane dye or, alternatively, may be a fine particle organic pigment. Specific examples of materials that may be used as coloring agents include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045) rhodamine 6G (C. I. 45160), Benzophenone compounds such as 2,4-dihydroxybenzophenone and 2,2',4,4'-tetrahydroxybenzophenone, salicylic acid compounds such as phenyl salicylate and 4-t-butylphenyl salicylate, phenylacrylate compounds such as ethyl-2-cyano-3,3-diphenylacrylate, and 2'-ethylhexyl-2-cyano-3,3-diphenylacrylate, benzotriazole compounds such as 2-(2-hydroxy-5-methylphenyl)-2H-benzotriazole, and 2-(3-t-butyl-2-hydroxy-5-methylphenyl)-5-chloro-2H-benzotriazole, coumarin compounds such as 4-methyl-7-diethylamino-1-benzopyran-2-one, thioxanthone compounds such as diethylthioxanthone, stilbene compounds, naphthalic acid compounds, azo dyes, Phthalocyanine blue, phthalocyanine green, iodine green, Victoria blue, naphthalene black, Photopia methyl violet, bromphenol blue and bromcresol green, laser dyes such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives may also be added to the photoresist 701 in order to promote adhesion between the photoresist 701 and an underlying layer upon which the photoresist 701 has been applied (e.g., the BARC layer 105). In an embodiment the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, 8-oxyquinoline, 4-hydroxypteridine and derivatives, 1,10-phenanthroline and derivatives, 2,2'-bipyridine and derivatives, benzotriazoles; organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations of these, or the like.

Surface leveling agents may additionally be added to the photoresist 701 in order to assist a top surface of the photoresist 701 to be level so that impinging light will not be adversely modified by an unlevel surface. In an embodiment surface leveling agents may include fluoroaliphatic esters, hydroxyl terminated fluorinated polyethers, fluorinated ethylene glycol polymers, silicones, acrylic polymer leveling agents, combinations of these, or the like.

In an embodiment the photoresist polymer resin and the PACs, along with any desired additives or other agents, are added to the photoresist solvent for application. Once added, the mixture is then mixed in order to achieve an even composition throughout the photoresist 701 in order to ensure that there are no defects caused by an uneven mixing or non-constant composition of the photoresist 701. Once mixed together, the photoresist 701 may either be stored prior to its usage or else used immediately.

Once ready, the photoresist 701 may be utilized by initially applying the photoresist 701 onto the BARC layer 105. The photoresist 701 may be applied to the BARC layer 105 so that the photoresist 701 coats an upper exposed surface of the BARC layer 105, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 701 may be applied such that it has a thickness over the surface of the BARC layer 105 of between about 10 nm and about 300 nm, such as about 150 nm.

Once the photoresist 701 has been applied to the semiconductor substrate, a pre-bake of the photoresist 701 is performed in order to cure and dry the photoresist 701 prior to exposure to finish the application of the photoresist 701. The curing and drying of the photoresist 701 removes the photoresist solvent component while leaving behind the photoresist polymer resin, the PACs, the photoresist cross-linking agents, and the other chosen additives. In an embodiment the pre-bake may be performed at a temperature suitable to evaporate the photoresist solvent, such as between about 40° C. and 150° C., although the precise temperature depends upon the materials chosen for the photoresist 701. The pre-bake is performed for a time sufficient to cure and dry the photoresist 701, such as between about 10 seconds to about 5 minutes, such as about 90 seconds.

Once applied, the photoresist 701 may be exposed to form an exposed region 703 and an unexposed region 705 within the photoresist 701. In an embodiment the exposure may be initiated by placing the substrate 101 and the photoresist 701, once cured and dried, into a photoresist imaging device 700 for exposure. The photoresist imaging device 700 may comprise a photoresist support plate 704, a photoresist energy source 707, a patterned mask 709 between the photoresist support plate 704 and the photoresist energy source 707, and photoresist optics 713. In an embodiment the photoresist support plate 704 is a surface to which the semiconductor device 100 and the photoresist 701 may be placed or attached to and which provides support and control to the substrate 101 during exposure of the photoresist 701. Additionally, the photoresist support plate 704 may be movable along one or more axes, as well as providing any desired heating or cooling to the substrate 101 and photoresist 701 in order to prevent temperature gradients from affecting the exposure process.

In an embodiment the photoresist energy source 707 supplies photoresist energy 711 such as light to the photoresist 701 in order to induce a reaction of the PACs, which in turn reacts with the photoresist polymer resin to chemically alter those portions of the photoresist 701 to which the photoresist energy 711 impinges. In an embodiment the photoresist energy 711 may be electromagnetic radiation, such as g-rays (with a wavelength of about 436 nm), i-rays (with a wavelength of about 365 nm), ultraviolet radiation, far ultraviolet radiation, x-rays, electron beams, or the like. The photoresist energy source 707 may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of photoresist energy 711, such as mercury vapor lamps, xenon lamps, carbon arc lamps or the like, may alternatively be utilized.

The patterned mask 709 is located between the photoresist energy source 707 and the photoresist 701 in order to block portions of the photoresist energy 711 to form a patterned energy 715 prior to the photoresist energy 711 actually impinging upon the photoresist 701. In an embodiment the patterned mask 709 may comprise a series of layers (e.g., substrate, absorbance layers, anti-reflective coating layers, shielding layers, etc.) to reflect, absorb, or otherwise block portions of the photoresist energy 711 from reaching those portions of the photoresist 701 which are not desired to be illuminated. The desired pattern may be formed in the patterned mask 709 by forming openings through the patterned mask 709 in the desired shape of illumination.

Optics (represented in FIG. 7A by the trapezoid labeled 713) may be used to concentrate, expand, reflect, or otherwise control the photoresist energy 711 as it leaves the photoresist energy source 707, is patterned by the patterned mask 709, and is directed towards the photoresist 701. In an embodiment the photoresist optics 713 comprise one or more lenses, mirrors, filters, combinations of these, or the like to control the photoresist energy 711 along its path. Additionally, while the photoresist optics 713 are illustrated in FIG. 7A as being between the patterned mask 709 and the photoresist 701, elements of the photoresist optics 713 (e.g., individual lenses, mirrors, etc.) may also be located at any location between the photoresist energy source 707 (where the photoresist energy 711 is generated) and the photoresist 701.

In an embodiment the semiconductor device 100 with the photoresist 701 is placed on the photoresist support plate 704. Once the pattern has been aligned to the semiconductor device 100, the photoresist energy source 707 generates the desired photoresist energy 711 (e.g., light) which passes through the patterned mask 709 and the photoresist optics 713 on its way to the photoresist 701. The patterned energy 715 impinging upon portions of the photoresist 701 induces a reaction of the PACs within the photoresist 701. The chemical reaction products of the PACs' absorption of the patterned energy 715 (e.g., acids/bases/free radicals) then reacts with the photoresist polymer resin, chemically altering the photoresist 701 in those portions that were illuminated through the patterned mask 709.

In a specific example in which the patterned energy 715 is a 193 nm wavelength of light, the PAC is a photoacid generator, and the group to be decomposed is a carboxylic acid group on the hydrocarbon structure and a cross linking agent is used, the patterned energy 715 will impinge upon the photoacid generator and the photoacid generator will absorb the impinging patterned energy 715. This absorption initiates the photoacid generator to generate a proton (e.g., a H+ ion) within the photoresist 701. When the proton impacts the carboxylic acid group on the hydrocarbon structure, the proton will react with the carboxylic acid group, chemically altering the carboxylic acid group and altering the properties of the photoresist polymer resin in general. The carboxylic acid group will then react with the photoresist cross-linking agent to cross-link with other photoresist polymer resins within the photoresist 701.

Optionally, the exposure of the photoresist 701 may occur using an immersion lithography technique. In such a technique an immersion medium (not individually illustrated in FIG. 2) may be placed between the photoresist imaging device 700 (and particularly between a final lens of the photoresist optics 713) and the photoresist 701. With this immersion medium in place, the photoresist 701 may be patterned with the patterned energy 715 passing through the immersion medium.

In this embodiment a protective layer (also not individually illustrated in FIG. 2) may be formed over the photoresist 701 in order to prevent the immersion medium from coming into direct contact with the photoresist 701 and leaching or otherwise adversely affecting the photoresist 701. In an embodiment the protective layer is insoluble within the immersion medium such that the immersion medium will not dissolve it and is immiscible in the photoresist 701 such that the protective layer will not adversely affect the photoresist 701. Additionally, the protective layer is transparent so that the patterned energy 715 may pass through the protective layer without hindrance.

In an embodiment the protective layer comprises a protective layer resin within a protective layer solvent. The material used for the protective layer solvent is, at least in part, dependent upon the components chosen for the photoresist 701, as the protective layer solvent should not dissolve the materials of the photoresist 701 so as to avoid degradation of the photoresist 701 during application and use of the protective layer. In an embodiment the protective layer solvent includes alcohol solvents, fluorinated solvents, and hydrocarbon solvents.

Specific examples of materials that may be utilized for the protective layer solvent include methanol, ethanol, 1-propanol, isopropanol, n-propanol, 1-butanol, 2-butanol, 2-methyl-2-propanol, 3-methyl-1-butanol, isobutyl alcohol, tert-butyl alcohol, 1-pentanol, 2-pentanol, 3-pentanol, n-hexanol, cyclohecanol, 1-hexanol, 1-heptanol, 1-octanol, 2-hexanol, 2-heptanol, 2-octanol, 3-hexanol, 3-heptanol, 3-octanol, 4-octanol, 2-methyl-2-butanol, 3-methyl-1-butanol, 3-methyl-2-butanol, 2-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-diol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, perfluorotetrapentylamine, toluene, xylene and anisole, and aliphatic hydrocarbon solvents, such as n-heptane, n-nonane, n-octane, n-decane, 2-methylheptane, 3-methylheptane, 3,3-dimethylhexane, 2,3,4-trimethylpentane, combinations of these, or the like.

The protective layer resin may, similar to the photoresist 701, comprise a protective layer repeating unit. In an embodiment the protective layer repeating unit may be an acrylic resin with a repeating hydrocarbon structure having a carboxyl group, an alicyclic structure, an alkyl group having one to five carbon atoms, a phenol group, or a fluorine atom-containing group. Specific examples of the alicyclic structure include a cyclohexyl group, an adamantyl group, a norbornyl group, an isobornyl group, a tricyclodecyl group, a tetracyclodododecyl group, and the like. Specific examples of the alkyl group include an n-butyl group, an isobutyl group, or the like. However, any suitable protective layer resin may alternatively be utilized.

The protective layer composition may also include additional additives to assist in such things as adhesion, surface leveling, coating, and the like. For example, the protective layer composition may further comprise a protective layer surfactant, although other additives may also be added, and all such additions are fully intended to be included within the scope of the embodiment. In an embodiment the protective layer surfactant may be an alkyl cationic surfactant, an amide-type quaternary cationic surfactant, an ester-type quaternary cationic surfactant, an amine oxide surfactant, a betaine surfactant, an alkoxylate surfactant, a fatty acid ester surfactant, an amide surfactant, an alcohol surfactant, an ethylenediamine surfactant, or a fluorine- and/or silicon-containing surfactant.

Specific examples of materials that may be used for the protective layer surfactant include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyooxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

Prior to application of the protective layer onto the photoresist 701, the protective layer resin and desired additives are first added to the protective layer solvent to form a protective layer composition. The protective layer solvent is then mixed to ensure that the protective layer composition has a consistent concentration throughout the protective layer composition.

Once the protective layer composition is ready for application, the protective layer composition may be applied over the photoresist 701. In an embodiment the application may be performed using a process such as a spin-on coating process, a dip coating method, an air-knife coating method, a curtain coating method, a wire-bar coating method, a gravure coating method, a lamination method, an extrusion coating method, combinations of these, or the like. In an embodiment the protective layer composition may be applied such that it has a thickness over the surface of the photoresist 701 of about 100 nm.

After the protective layer composition has been applied to the photoresist 701, a protective layer pre-bake may be performed in order to remove the protective layer solvent. In an embodiment the protective layer pre-bake may be performed at a temperature suitable to evaporate the protective layer solvent, such as between about 40° C. and 150° C., although the precise temperature depends upon the materials chosen for the protective layer composition. The protective layer pre-bake is performed for a time sufficient to cure and dry the protective layer composition, such as between about 10 seconds to about 5 minutes, such as about 90 seconds.

Once the protective layer has been placed over the photoresist 701, the semiconductor device 100 with the photoresist 701 and the protective layer are placed on the photoresist support plate 704, and the immersion medium may be placed between the protective layer and the photoresist optics 713. In an embodiment the immersion medium is a liquid having a refractive index greater than that of the surrounding atmosphere, such as having a refractive index greater than 1. Examples of the immersion medium may include water, oil, glycerine, glycerol, cycloalkanols, or the like, although any suitable medium may alternatively be utilized.

The placement of the immersion medium between the protective layer and the photoresist optics 713 may be done using, e.g., an air knife method, whereby fresh immersion medium is applied to a region between the protective layer and the photoresist optics 713 and controlled using pressurized gas directed towards the protective layer to form a barrier and keep the immersion medium from spreading. In this embodiment the immersion medium may be applied, used, and removed from the protective layer for recycling so that there is fresh immersion medium used for the actual imaging process.

However, the air knife method described above is not the only method by which the photoresist 701 may be exposed using an immersion method. Any other suitable method for imaging the photoresist 701 using an immersion medium, such as immersing the entire substrate 101 along with the photoresist 701 and the protective layer, using solid barriers instead of gaseous barriers, or using an immersion medium without a protective layer, may also be utilized. Any suitable method for exposing the photoresist 701 through the immersion medium may be used, and all such methods are fully intended to be included within the scope of the embodiments.

After the photoresist 701 has been exposed to the patterned energy 715, a post-exposure baking may be used in order to assist in the generating, dispersing, and reacting of the acid/base/free radical generated from the impingement of the patterned energy 715 upon the PACs during the exposure. Such assistance helps to create or enhance chemical reactions which generate chemical differences between the exposed region 703 and the unexposed region 705 within the photoresist 701. These chemical differences also caused differences in the solubility between the exposed region 703 and the unexposed region 705. In an embodiment this post-exposure baking may occur at temperatures of between about 50° C. and about 160° C. for a period of between about 40 seconds and about 120 seconds.

FIG. 7B illustrates a development of the photoresist 701 with the use of a developer 717 after the photoresist 701 has been exposed. After the photoresist 701 has been exposed and the post-exposure baking has occurred, the photoresist 701 may be developed using either a positive tone developer or a negative tone developer, depending upon the desired pattern for the photoresist 701. In an embodiment in which the exposed region 703 of the photoresist 701 is desired to be removed to form a positive tone, a positive tone developer such as a basic aqueous solution may be utilized to remove those portions of the photoresist 701 which were exposed to the patterned energy 715 and which have had their solubility modified and changed through the chemical reactions. Such basic aqueous solutions may include tetra methyl ammonium hydroxide (TMAH), tetra butyl ammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, potassium metasilicate, sodium carbonate, tetraethylammonium hydroxide, combinations of these, or the like.

If a negative tone development is desired, an organic solvent or critical fluid may be utilized to remove those portions of the photoresist 701 which were not exposed to the energy and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

However, as one of ordinary skill in the art will recognize, the above description of positive tone developers and negative tone developers are only intended to be illustrative and are not intended to limit the embodiments to only the developers listed above. Rather, any suitable type of developer, including acid developers or even water developers, that may be utilized to selectively remove a portion of the photoresist 701 that has a different property (e.g., solubility) than another portion of the photoresist 701, may alternatively be utilized, and all such developers are fully intended to be included within the scope of the embodiments.

In an embodiment in which immersion lithography is utilized to expose the photoresist 701 and a protective layer is utilized to protect the photoresist 701 from the immersion medium, the developer 717 may be chosen to remove not only those portions of the photoresist 701 that are desired to be removed, but may also be chosen to remove the protective layer in the same development step. Alternatively, the protective layer may be removed in a separate process, such as by a separate solvent from the developer 717 or even an etching process to remove the protective layer from the photoresist 701 prior to development.

FIG. 7B illustrates an application of the developer 717 to the photoresist 701 using, e.g., a spin-on process. In this process the developer 717 is applied to the photoresist 701 from above the photoresist 701 while the semiconductor device 100 (and the photoresist 701) is rotated. In an embodiment the developer 717 may be supplied at a flow rate of between about 100 c.c./min and about 2000 c.c./min, such as about 600 c.c./min, while the semiconductor device 100 is being rotated at a speed of between about 300 rpm and about 3000 rpm, such as about 2000 rpm. In an embodiment the developer 717 may be at a temperature of between about 10° C. and about 80° C., such as about 50° C., and the development may continue for between about 1 minute to about 60 minutes, such as about 30 minutes.

However, while the spin-on method described herein is one suitable method for developing the photoresist 701 after exposure, it is intended to be illustrative and is not intended to limit the embodiments. Rather, any suitable method for development, including dip processes, puddle processes, and spray-on processes, may alternatively be used. All such development processes are fully intended to be included within the scope of the embodiments.

FIG. 7B illustrates a cross-section of the development process in an embodiment in which a negative tone developer is used to remove the unexposed regions of the photoresist 701. As illustrated, the developer 717 is applied to the photoresist 701 and dissolves the unexposed portion 705 of the photoresist 701. This dissolving and removing of the unexposed portion 705 of the photoresist 701 leaves behind an opening within the photoresist 701 that patterns the photoresist 701 in the shape of the patterned energy 715, thereby transferring the pattern of the patterned mask 709 to the photoresist 701.

Once the photoresist 701 has been patterned, the pattern may be transferred to the BARC layer 105. In an embodiment in which the BARC layer 105 remains insoluble to the developer 717, the BARC layer 105 may be removed using an etching process that utilizes the photoresist 701 (now patterned) as a masking layer. The etching process may be a dry etch process utilizing an etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, trifluoromethane, tetrafluoromethane, perfluorocyclobutane, perfluoropropane, combinations of these, or the like. However, any other suitable etch process, such as a wet etch, and any other suitable etchants may alternatively be used.

Alternatively, in an embodiment in which the BARC layer 105 comprises an acid labile group that can react to de-crosslink the cross-linked polymers in the BARC layer 105 and change the solubility of the BARC layer 105, the BARC layer 105 may be patterned during the development process by the developer 717. In particular, during exposure the photoacid generators may generate an acid in the BARC layer 105, which will work to break the cross-linking bonds and change the solubility of the BARC layer 105. Then, in a positive tone development process, a positive tone developer may be used to remove both the photoresist 717 that had been exposed as well as to remove the BARC layer 105 in the same process. Any suitable patterning process, with any suitable number of steps, may be utilized to pattern and remove both the photoresist 717 and the BARC layer 105, and all such processes and steps are fully intended to be included within the scope of the embodiments.

Figure 8A:
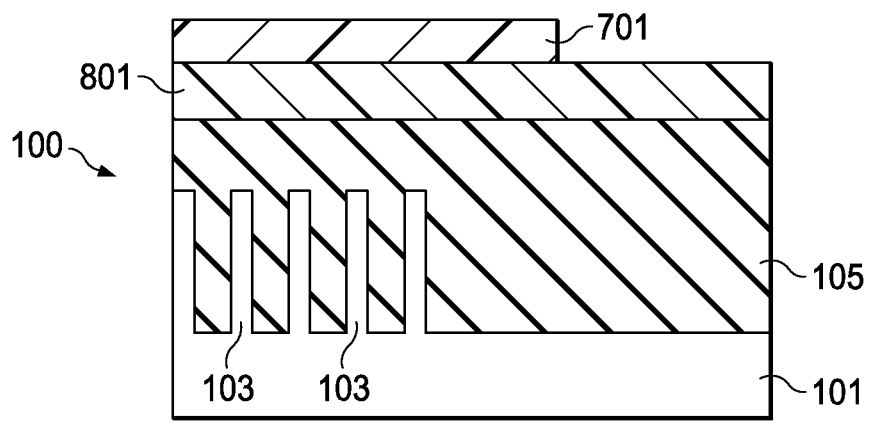
FIGS. 8A-8B illustrate a use of the anti-reflective layer as an underlayer in a tri-layer process in accordance with an embodiment.

FIG. 8 illustrates another embodiment utilizing the BARC layer 105, instead of simply being utilized as an anti-reflective coating, is utilized as an underlayer used along with a hard mask layer 801. In such an embodiment the BARC layer 105 may be formed as described above with respect to FIG. 1. Once formed, however, instead of placing the photoresist 701 directly on the BARC layer 105, a hard mask layer 801 is formed on the BARC layer 801.

In an embodiment the hard mask layer 801 may be a hardmask material such as silicon nitride, oxides, oxynitrides, silicon carbide, combinations of these, or the like. The hardmask material for the hard mask layer 801 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hardmask material may be utilized, and all such methods or combination are fully intended to be included within the scope of the embodiments. The hard mask layer 801 may be formed to a thickness of between about 100 Å and about 800 Å, such as about 300 Å.

Once a layer of the hardmask material for the hard mask layer 801 has been formed, the photoresist 701 may be placed and patterned over the hard mask material for the hard mask layer 801. The placement of the photoresist 701 over the hard mask material for the hard mask layer 801 and the patterning of the photoresist 701 may be similar to the placement of the photoresist 701 and the development of the photoresist as described above with respect to FIG. 7A-7B. For example, the photoresist 701 may be placed using a spin-on process, illuminated using the photoresist imaging device 700, and then developed using the developer 717.

Figure 8B:
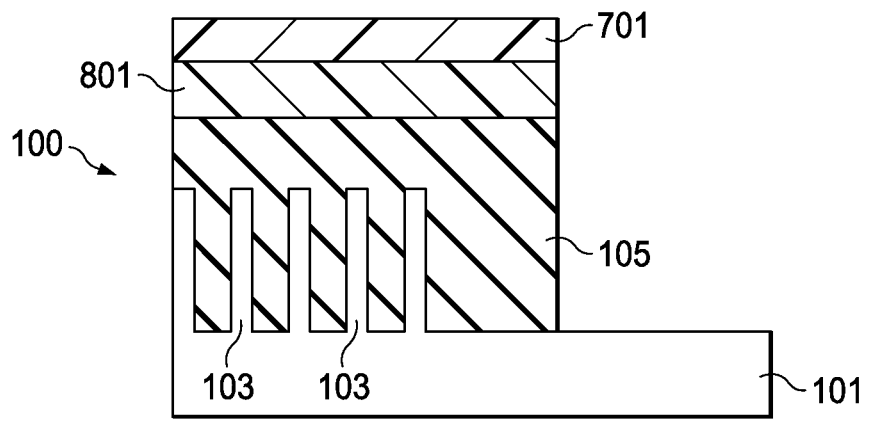

FIG. 8B illustrates that, once the photoresist 701 has been patterned into the desired pattern, the photoresist 701 may be used as a mask to pattern the hard mask material of the hard mask layer 801. For example, the pattern of the photoresist 701 may be transferred to the hard mask layer 801 using a anisotropic etching process such as reactive ion etching (RIE), whereby ions of a suitable etchant such as $CF_4/O_2$, may be utilized in a dry etch to remove portions of the hard mask layer 801 exposed by the patterned photoresist 701. However, any other suitable etchant, such as $CHF_3/O_2$, $CH_2F_2$, $CH_3F$, or the like, and any other suitable method of removal, may alternatively be used.

FIG. 8B further illustrates that once the pattern of the photoresist 701 has been transferred to the hard mask 801, the hard mask 801 may be used to transfer the pattern of the photoresist 701 to the BARC layer 105. In an embodiment the BARC layer 105 may be removed using an etching process that utilizes the photoresist 701 and the hard mask 801 (now patterned) as a masking layer. The etching process may be a dry etch process utilizing an etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, trifluoromethane, tetrafluoromethane, perfluorocyclobutane, perfluoropropane, combinations of these, or the like. However, any other suitable etch process, such as a wet etch, and any other suitable etchants may alternatively be used.

By utilizing the BARC layer 105 as an underlayer and just as an anti-reflective coating, a more uniform layer may be formed over a variety of different underlying terrains. By creating a more uniform layer, subsequent processing may be better controlled, leading to a more efficient manufacturing process capable of making devices with smaller and smaller dimensions.

In accordance with an embodiment, a method for manufacturing a semiconductor device comprising applying an anti-reflective coating layer onto a substrate, the anti-reflective coating layer comprising a resin with a locked monomer is provided. The volume of the anti-reflective coating layer is expanded by unlocking the locked monomer.

In accordance with an embodiment, a method of manufacturing a semiconductor device applying an anti-reflective coating to a substrate, the anti-reflective coating comprising a polymer resin with repeating units, wherein at least one of the repeating units comprises a lock located within a cyclic structure, is provided. A chemically reactive species is generated from a catalyst within the anti-reflective coating, the chemically reactive species cleaving the lock to break the cyclic structure.

In accordance with an embodiment, an anti-reflective material comprising a polymer resin, wherein the polymer resin comprises a locked cyclic structure and a catalyst is provided. The catalyst can generate a chemically reactive species capable of unlocking the locked cyclic structure.

Although the present embodiments and their advantages have been described in detail, it should be understood that various changes, substitutions and alterations can be made herein without departing from the spirit and scope of the disclosure as defined by the appended claims. For example, many different monomers may be used to form the material of the BARC layer 105, and may different processes may be utilized to form, apply, and develop the photoresist.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a semiconductor device, the method comprising:
applying an anti-reflective coating layer onto a substrate, the anti-reflective coating layer comprising a resin with a locked monomer; and
expanding a volume of the anti-reflective coating layer by unlocking the locked monomer.

2. The method of claim 1, wherein the unlocking the locked monomer comprises exposing the anti-reflective coating to an energy source.

3. The method of claim 2, wherein the exposing the anti-reflective coating to an energy source generates an acid from a photoacid generator within the anti-reflective coating layer.

4. The method of claim 2, wherein the exposing the anti-reflective coating to an energy source generates a base from a photobase generator within the anti-reflective coating layer.

5. The method of claim 1, wherein the unlocking the locked monomer comprises heat treating the anti-reflective coating to generate an acid from a thermal acid generator.

6. The method of claim 1, wherein the locked monomer comprises a cyclic structure with a lock located within the cyclic structure.

7. The method of claim 6, wherein the lock is an ester.

8. A method of manufacturing a semiconductor device, the method comprising:
applying an anti-reflective coating to a substrate, the anti-reflective coating comprising a polymer resin with repeating units, wherein at least one of the repeating units comprises a lock located within a cyclic structure; and
generating a chemically reactive species from a catalyst within the anti-reflective coating, the chemically reactive species cleaving the lock to break the cyclic structure.

9. The method of claim 8, wherein the lock is an ester.

10. The method of claim 8, wherein the generating the chemically reactive species comprises exposing the anti-reflective coating to an energy source.

11. The method of claim 8, wherein the catalyst is a photoacid generator.

12. The method of claim 8, wherein the catalyst is a photobase generator.

13. The method of claim 8, further comprising performing a first bake to cross-link the polymer resin.

14. The method of claim 13, wherein the generating the chemically reactive species comprises performing a second bake different from the first bake to generate an acid from a thermal acid generator.

15. A method of manufacturing a semiconductor device, the method comprising:

applying a bottom anti-reflective coating onto a substrate, the bottom anti-reflective coating comprising a polymer resin, the polymer resin comprising a cyclic structure; and modifying the cyclic structure into at least a partial linear structure.

16. The method of claim 15, wherein the modifying the cyclic structure is performed at least in part by cleaving a lock within the cyclic structure.

17. The method of claim 16, wherein the cyclic structure comprises chromophore units.

18. The method of claim 15, wherein the modifying the cyclic structure is performed at least in part by baking the bottom anti-reflective coating.

19. The method of claim 15, wherein the bottom anti-reflective coating further comprises a catalyst.

20. The method of claim 15, further comprising applying a photoresist layer over the bottom anti-reflective coating after the modifying the cyclic structure into at least the partial linear structure.

* * * * *